United States Patent [19]
Hobbs et al.

[11] Patent Number: 5,516,608
[45] Date of Patent: May 14, 1996

[54] METHOD FOR CONTROLLING A LINE DIMENSION ARISING IN PHOTOLITHOGRAPHIC PROCESSES

[75] Inventors: Philip C. D. Hobbs, Briarcliff Manor, N.Y.; Steven Holmes, Burlington, Vt.; Robert Jackson, Millbrook, N.Y.; Jerry C. Shaw, Ridgefield, Conn.; John L. Sturtevant, Essex, Vt.; Theodore G. van Kessel, Millbrook, N.Y.

[73] Assignee: International Business Machines Corporation, Armonk, N.Y.

[21] Appl. No.: 203,212

[22] Filed: Feb. 28, 1994

[51] Int. Cl.$^6$ ............................. G03C 5/00; G01B 9/02; G01B 11/02
[52] U.S. Cl. ..................... 430/30; 430/330; 356/354; 356/355; 356/357; 356/384
[58] Field of Search ................. 430/30, 330; 356/354, 356/355, 357, 384

[56] References Cited

U.S. PATENT DOCUMENTS 5,124,216  6/1992  Giapis et al. ........................... 430/30

FOREIGN PATENT DOCUMENTS 9215923  9/1992  WIPO ..................................... 430/30

OTHER PUBLICATIONS

Hickman, Gaspar, Bishop, Nagui, McNeil, Tipton, Stallard, & Draper Use of Diffracted Light from Latent Images to Improve Lithography Control, Proceedings of the International Society for Optical Engineering, Integrated Circuit Metrology, Inspection and Process Control, Mar. 1991 pp. 245–257.

Lamola et al; Chemically Amplified Resists; Solid State Technology, Aug. 1991, pp. 53–58.

*Primary Examiner*—Marion E. McCamish
*Assistant Examiner*—Bernard P. Codd
*Attorney, Agent, or Firm*—Scully, Scott, Murphy & Presser

[57] ABSTRACT

In a photolithographic process utilizing a wafer coated with a chemically amplified photoresist, a method for controlling a line dimension. The method comprises the steps of measuring at at least two times, and from at least two angles, evolving signals comprising intensities of light diffracted from a portion of an exposed patterned area on the wafer, the evolving signals corresponding to vector combinations of time dependent light diffracted from the pattern appearing in the photoresist; and substantially time invariant light diffracted due to any underlying pattern beneath the photoresist; and, combining the measurements mathematically for extracting a contribution due to the pattern evolving in the photoresist.

2 Claims, 6 Drawing Sheets

METHOD FOR CONTROLLING A LINE DIMENSION ARISING IN PHOTOLITHOGRAPHIC PROCESSES

FIELD OF THE INVENTION

This invention relates to semiconductor devices, and in particular, to photolithographic processes comprising a use of a chemically amplified photoresist.

Introduction to the Invention

It is known to develop semiconductor devices, for example, DRAM's, by way of stages including inter alia resist application, expose, bake and develop. Moreover, to an end of providing an adequate process capability for manufacturing such a developed semiconductor, it is known to employ deep-ultraviolet (DUV) lithography techniques, especially as semiconductor device dimensions shrink below 500 nm.

DUV lithography preferably employs ultra high sensitivity photoresists, due to their generally low spectral output available at 250 nm. For example, chemically amplified resists can offer this sensitivity by using a single photogenerated acid molecule to catalytically drive multiple chemical reactions in the resist film. The number of chemical reaction cycles or catalytic chain length (CCL) is typically in excess of 100, and can approach 1000. A post-exposure bake (PEB) process is preferably used to increase a reaction rate to a time scale compatible with that of wafer processing.

SUMMARY OF THE INVENTION

We have discerned that a use of chemically amplified photoresist for DUV lithography can place tight control requirements on exposure dose, resist sensitivity, post bake time and post bake temperature. To date, only an extensive use of heuristic trial product wafers allows the photo-process to operate within design limits. This procedure, notwithstanding a marginal utility, has significant deficiencies and problems, since the procedure requires a heavy investment of tool time, entails lengthy delays waiting for test results, and is extremely costly, for example consuming a significant capacity of the photolithography section.

Restated, no satisfactory means of endpoint detection presently exists. Theoretically, one could rely on a dead reckoning process based on calibration of initial dimensions as a function of exposure, resist sensitivity, and bake time and temperature. However, this "open-loop" process may be unworkable due to an extremely high ($0.05\mu/°$ C.) sensitivity of line width to these process variables, especially compared to a current line width tolerance of $0.1\mu$ ($3\sigma$) out of $0.5\mu$ nominal. This situation is illustrated in FIG. 1. We note that the situation can only get worse as feature size shrinks.

In response and in satisfaction of the just noted problems and deficiencies with respect to DUV lithography, we have now discovered a novel method for controlling a line dimension as it arises in photolithography. In particular, the novel method of the present invention can provide a capability for a real-time in-line control of critical dimensions for positive-tone chemically amplified resist systems, for purposes of DUV photo-process control.

The novel method, which is suitable for use in a photolithographic process utilizing a wafer coated with a chemically amplified photoresist, comprises the steps of:

(1) measuring, at at least two times and from at least two angles, evolving signals comprising intensities of light diffracted from a portion of an exposed patterned area on the wafer,
the evolving signals corresponding to vector combinations
   (i) time dependent light diffracted from the pattern appearing in the photoresist; and
   (ii) substantially time invariant light diffracted due to any underlying pattern beneath the photoresist; and
(2) combining the measurements mathematically for extracting a contribution due to the pattern evolving in the photoresist;
thereby obtaining an estimator of a line dimension in the photoresist pattern.

The novel method as defined can realize several significant advantages.

First of all, the novel method has a critical advantage of eliminating the negative aspects that we discern with respect to extant DUV lithography techniques, so that the virtues of these techniques can be retained, but now in all enhanced manner. In favor of the current negative associated effects of photolithography with chemically amplified photoresist, namely, a very unforgiving, poorly controlled open-loop process for a critical processing function, including a very large overhead for send-aheads, the novel method, in sharp contrast, comprises a closed-loop potentiality, and can turn DUV lithography techniques into a well-controlled forgiving process with few send-aheads. This advantage, moreover, may be realized by way of a simple, robust and inexpensive optical assembly, comprising conventional components with no moving parts.

BRIEF DESCRIPTION OF THE DRAWINGS

The invention is illustrated in the accompanying drawing, in which.

DETAILED DESCRIPTION OF THE INVENTION

In overview, the novel method preferably relies on generating a diffraction grating in a resist film when a latent image appears during a post-exposure bake. A simple optical illumination/collection assembly, specified below and in FIG. 5, can allow a diffracted signal to be measured during a post-exposure bake. This signal, in turn, can be correlated to linewidth when measured by a non-destructive SEM. The result is a post-exposure bake time that can be used to correct in closed-loop fashion, exposure-and-bake temperature variations, to thereby efficiently provide an overall process control.

Figure 1:
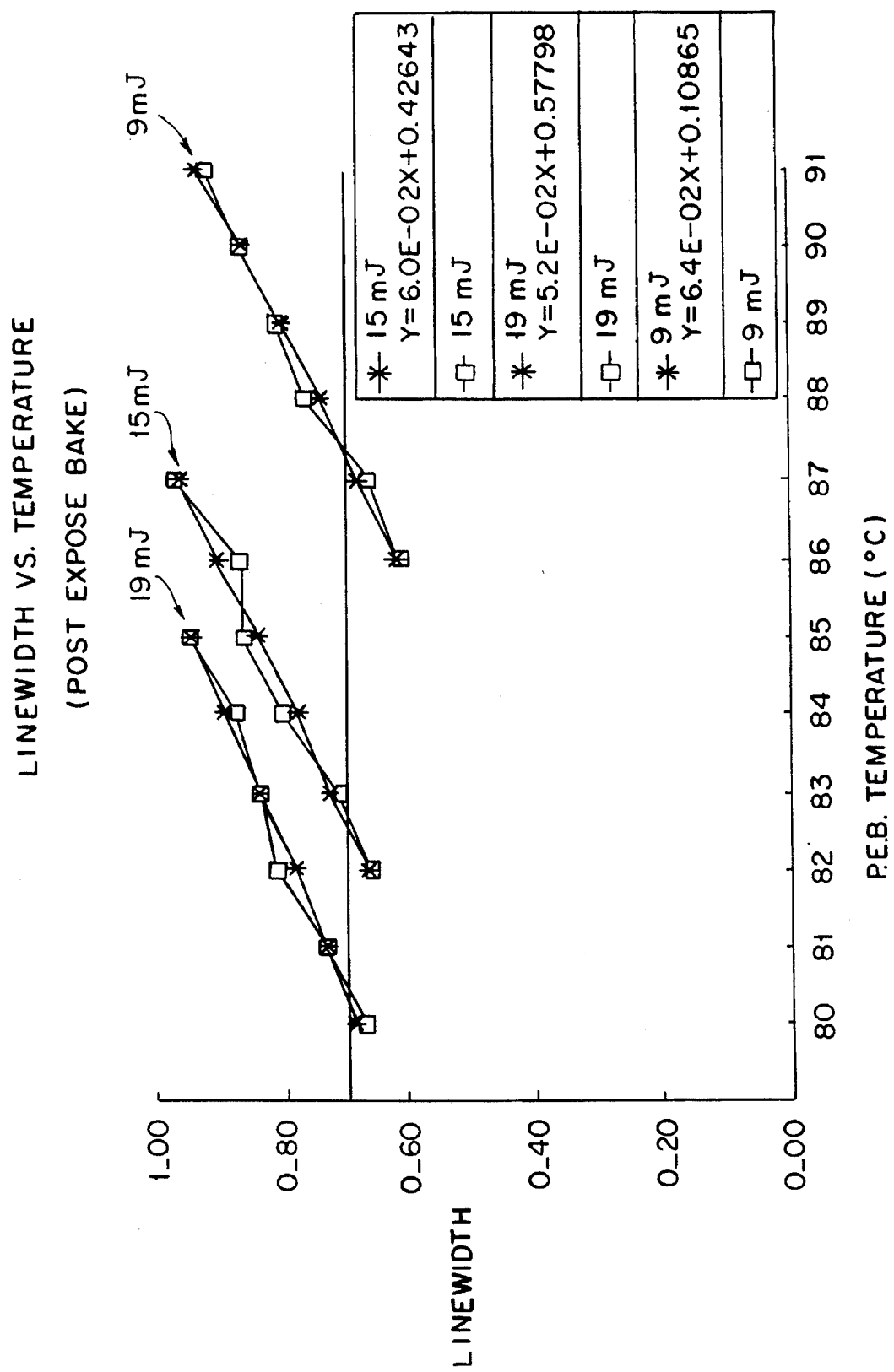
FIG. 1 provides a plot of initial dimension sensitivity vs exposure and bake temperature, derived from a DUV lithography process.
Figure 2:
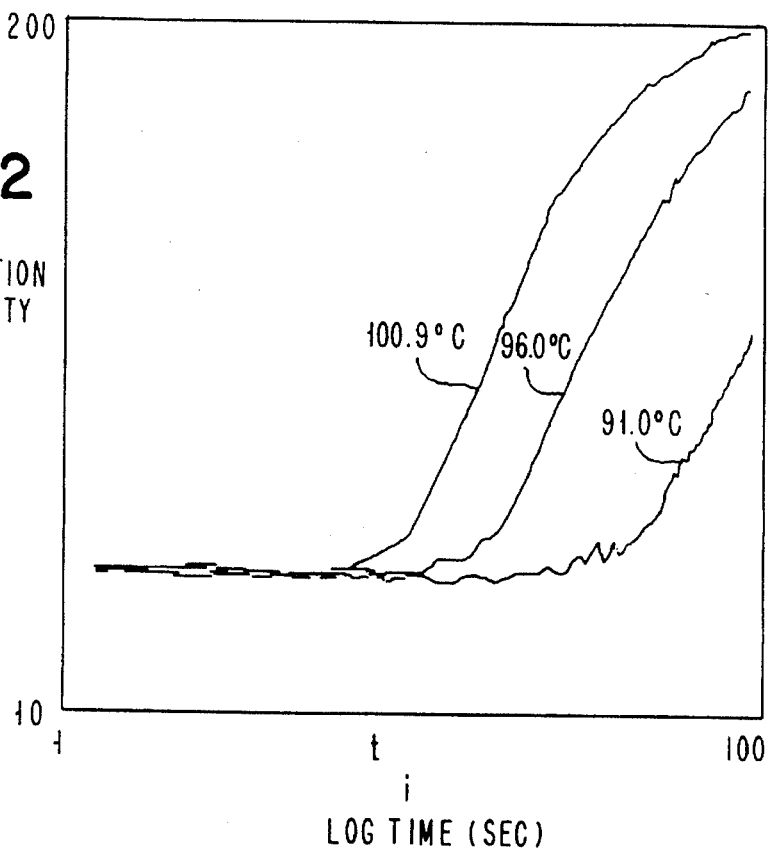
FIG. 2 shows a real time DUV response at high dose and multiple temperature.
Figure 3:
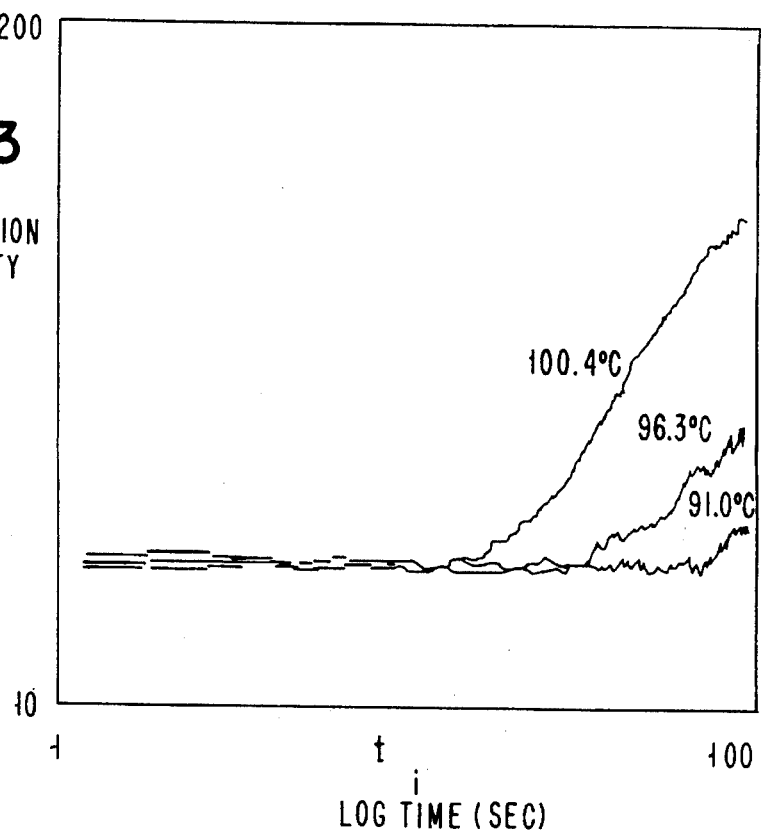
FIG. 3 shows a real time DUV response at low dose and multiple temperatures.
Figure 4:
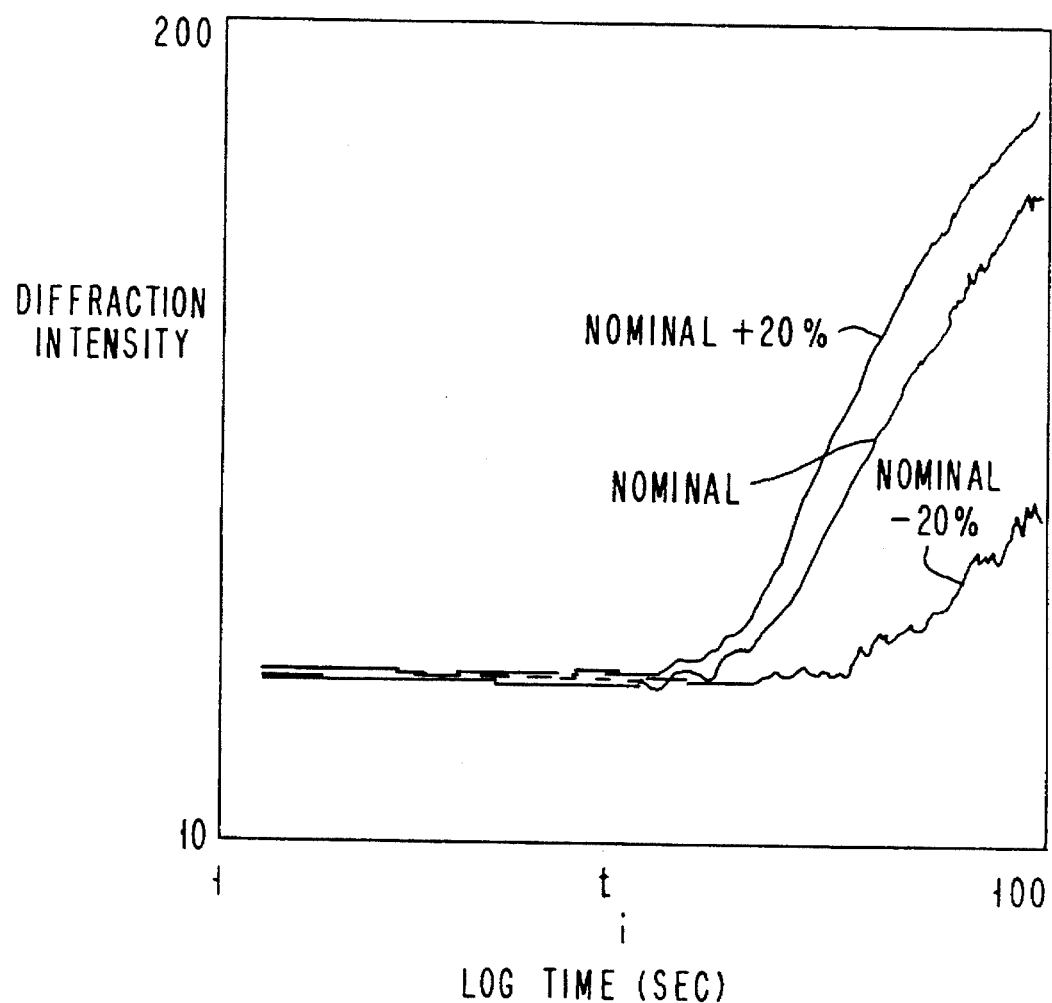
FIG. 4 shows a real time DUV response at constant temperature for multiple doses.

The novel method takes advantage of the fact that current, typical memory products take the form of closely spaced (1.2 microns pitch) two dimensional array of cells, and that typical logic products are highly periodic comprising arrays of gates forming critical master slice levels. The novel method exploits these facts by utilizing the product area itself or suitable test structure, as a phase grating, and measuring a change in diffraction efficiency to obtain a real-time indication of the state of completion of the post expose bake process. We note that real time observations of 0.5 micron periodic structure on product confirms the high utility of the novel method, and that it can yield a response that agrees with experience with respect to the parametric effects of exposure dose, bake time and bake temperature. This is shown in FIGS. 2, 3 and 4.

Figure 5:
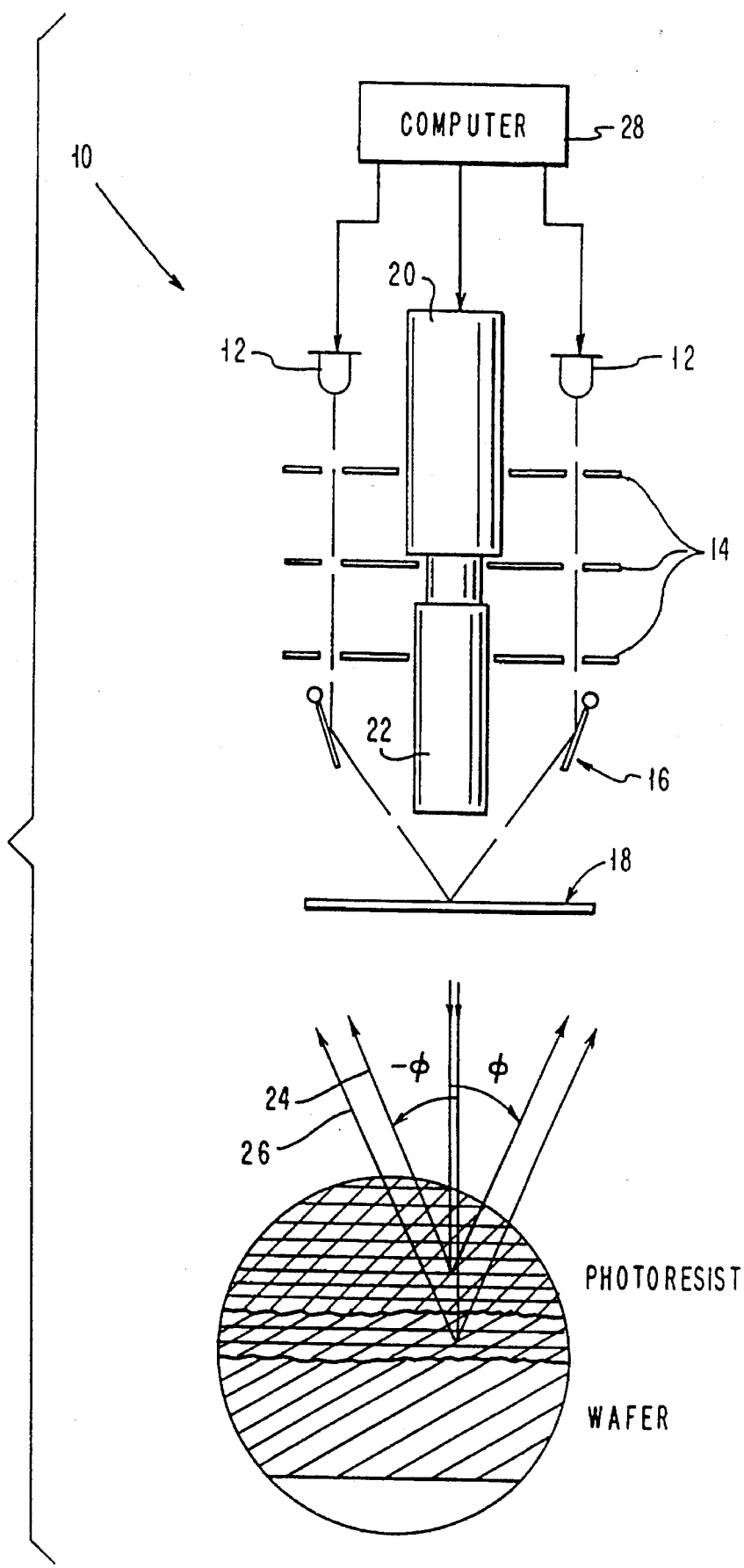
FIG. 5 shows an optical diffraction sensor assembly that may be employed to realize the present invention.

As alluded to above, the novel method may be realized by way of an optical illumination/collection assembly, of an exemplary type shown in FIG. 5.

In overview, the FIG. 5 assembly 10 includes the following components. First, there is a set of conventional illumination sources 12, preferably comprising LED's and preferably arranged in an angular ring. LED's are preferred because of their brightness (2000 mCd), and the fact that a narrow-band incoherent light can be reasonably collimated with conventional baffles 14 to illuminate a large area. The light is preferably directed to a central focus using first-surface aluminum mirrors 16 to illuminate an area of approximately 1.5×2.0 cm. The illumination area preferably coincides with the center of a wafer 18, and preferably is imaged to a conventional RS-170 CCD camera 20 directly overhead, through a simple 3 element lens 22. Note in FIG. 5 a ray 24 comprising time dependent diffracted light from a photoresist, and a ray 26 comprising time invariant diffracted light from an underlying pattern.

Figure 6A:
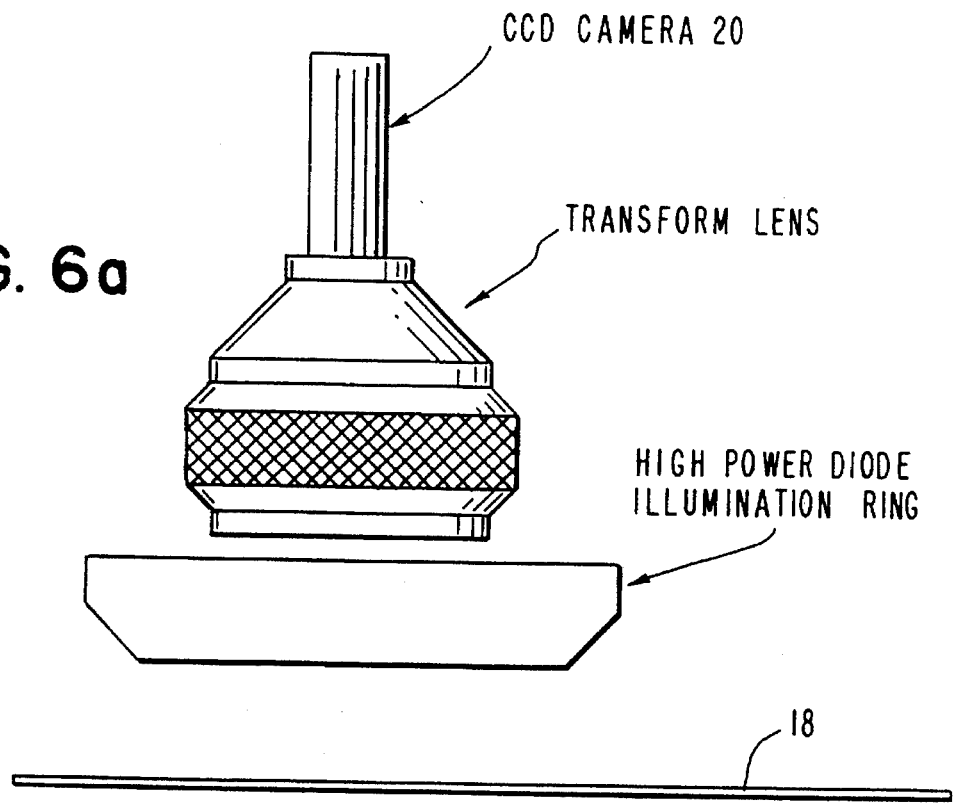
FIG. 6 is an illustration of a ring illumination configuration.
Figure 6B:
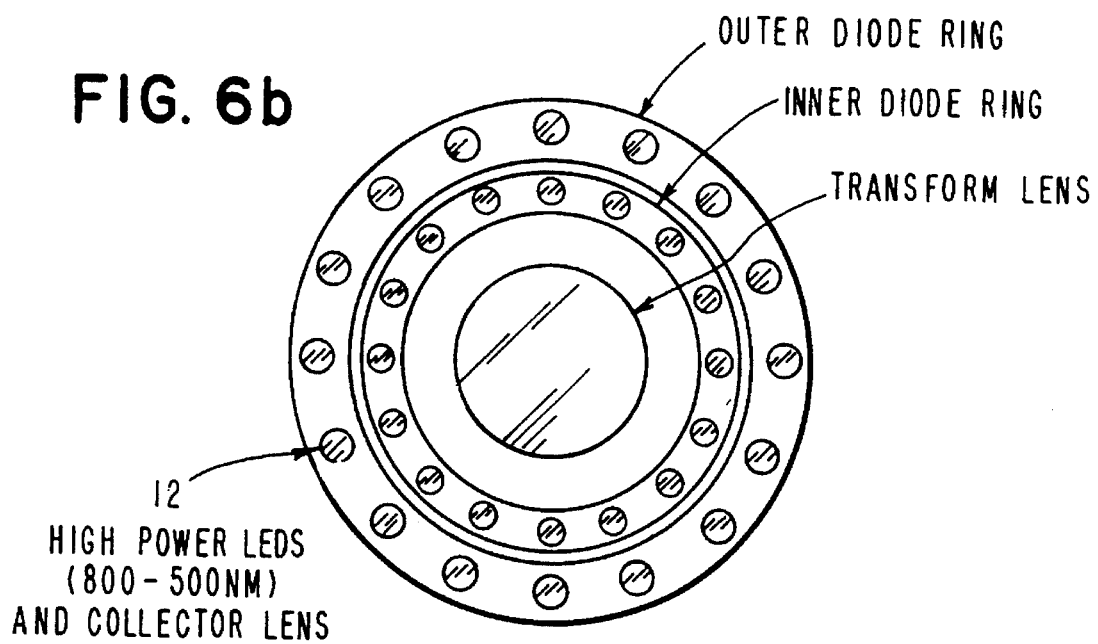

FIGS. 6a,b show side and bottom views of one variation of the structural theme suggested in FIG. 5, namely, an even number (24) of LEDs 12 arranged in a ring around the camera axis lens. Note that by switching on the different diametrically opposed pairs, the illumination axis can be rotated with no moving parts, allowing the diffraction geometry to be essentially independent of wafer 18 orientation.

When a wafer 18 to be baked drops onto a hot plate, a diffracted signal seen by the camera 20 arises solely from the underlying pattern from previous lithography steps. As the resist bakes, a thermally activated catalytic reaction (chemical amplification) occurs in the exposed regions, which gradually forms an amplified latent image, and which functions as a phase diffraction grating. The additional diffracted light from the resist phase grating can change the intensity of the detected diffracted spot; the detected signal change from the camera 20 is a measure of the strength of the latent image. The signal from the camera 20 preferably is digitized in a known way by a commercial "frame grabber" card in a small computer 28. The diffraction peak may be located in the image frame by a simple pattern-recognition algorithm (explained below), and its intensity measured as a function of time. The thresholding algorithm looks at this time log until the end point condition is met, at which time the computer 24 terminates the bake.

To achieve a simple measurement protocol, the data must be independent of wafer 18 position and orientation. The position dependence is substantially eliminated by looking at the intensity of the diffraction from a large illuminated field; since the intensity is proportional to the squared modulus of the Fourier transform of the grating structure, it is essentially translationally invariant. The collimated light sources 12, imaging lens 22 and sensor area are chosen such that a sufficiently large area is illuminated and imaged to allow certain inclusion of a sufficient amount of the target region for measurement. In general, this area is chosen to be larger than or equal to the size of the chip sites. Residual variations caused by the positions of individual chip sites within the field of view are removed by the normalization property of the end point threshold algorithm. The orientation dependence of the pattern must be removed by the normalization property of the end point threshold algorithm. The orientation dependence of the pattern must be removed by rotating the light source. The large area illumination averages out any perturbation from small local nonuniformities in the pattern, and the diffraction geometry allows the use of low numerical aperture optics, which need not be close to the wafer 18, and so escape the temperature extremes and lens contamination problems.

The novel method call easily be generalized by using several copies on a wafer, to provide information on uniformity of bake, exposure, and sensitivity. Detectors other than cameras can be used as well, provided that some other method (such as an auxiliary camera) is used for orientation control. Unfavorable interference effects between the diffracted light from the underlying pattern and the latent image can be eliminated by varying the angle of incidence, wavelength, and polarization of the illumination, and by putting a polarization analyzer on the camera.

Pattern recognition algorithm

In order to determine the intensity of the diffracted peak, it must first be located in the field of view of the camera 20. This requires a pattern recognition algorithm. The simplicity of the image structure (bright blobs on a dark background) lends itself to the algorithm. The array containing the image data is hard-clipped, forming a binary image consisting of isolated regions of 1s (peak regions) in a large sea of 0s. Following clipping, the array is searched to locate each peak region and compute its centroid. The coordinates of the centroids are stored in a list. This list is compared to a master list containing the centroids of an ideal diffraction pattern for the pattern being examined (one master list is required for each diode pair, in order to take account of the rotation of the pattern due to the rotation of the axis of illumination). The match between the two lists depends on the orientation of the wafer 18 and on which LEDs 12 are illuminated. A rotation of the wafer 18 causes the diffracted spots from the two LEDs to rotate ill opposite directions in the image, because the camera sees the positive diffraction orders from one and the negative orders from the other. If each detected spot does not fall within its predefined rectangle (whose size is determined by the angular spacing of the LEDs), the computer 24 selects the next pair of LEDs, and so on until a match is found. In this way, the angle between the axis of the pattern and that of the illumination is made constant.

This method of illumination is discrete while the detection method allows simultaneous viewing of a range of diffraction angles. Multiple concentric illumination rings extend the illumination to additional discrete angles and wavelengths. The specific angles needed for a given product are determined by the diffraction equation and are in general fixed quantities for all levels of that product. The use of multiple illumination rings accommodates multiple product groups.

Each illumination source is optionally constructed to allow S- or P-polarized wave illumination through the use of a polarizer and or electro-optic modulator such as a ferroelectric liquid crystal (flc) retarder, to allow the grating response to be optimized or normalized to take into account the variation in diffraction efficiency as a function of incident angle for S- and P-polarized illumination.

End Point Detection Algorithm

Figure 7:
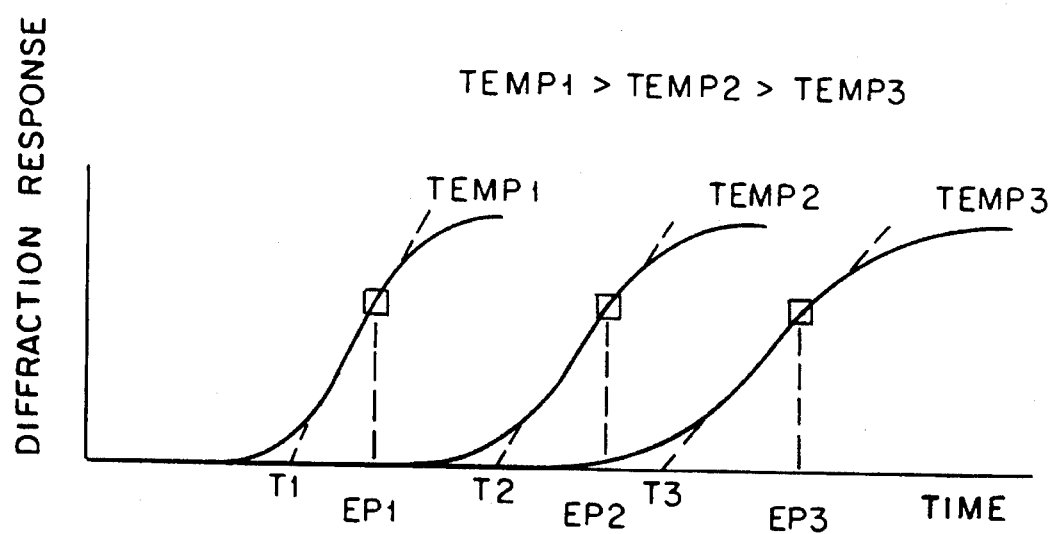
FIG. 7 is an illustration of signal interpretation.

The end point is sensed by comparing the end point ratio (defined below) to a predetermined threshold value obtained by correlating it with critical dimension (CD) measurement of the developed pattern, as shown in FIG. 7. End point ratio is defined as $$EP(t) = \frac{I_D(t) - I_D(at)}{I_D(t) - I_D(t_0)},$$

where $I_D$ is the diffraction efficiency, t is time, and $0<a<1$ is a stretch factor. This definition is one of many possibilities, and takes account of the variation of the speed of the chemical amplification as a function of time, as well as gain and offset variations, sample reflectivity, and illumination intensity.

Like most thermally activated reactions, the chemical amplification process is linear in log(time), and its rate is exponential in temperature. The critical dimensions of the developed pattern depend sensitively on the process parameters of exposure resist sensitivity, bake time and temperature, which are difficult to control individually to the required accuracy. They do interact, however; a slight underexposure, for example, can be compensated by a slight increase in bake time. Hitherto, there has been no mechanism for taking advantage of this favorable situation. The novel method measures the strength of the latent image directly, and this strength is strongly correlated with the critical dimensions; thus we can now compensate in the bake step for minor variations in the other parameters, eliminating a major yield detractor.

What is claimed:

1. In a photolithographic process utilizing a wafer coated with a chemically amplified photoresist, a method for controlling a line dimension in a photoresist pattern, the method comprising the steps of:

(1) measuring, at least two times and from at least two angles, time evolving signals comprising intensities of light diffracted from a portion of an exposed patterned area on a wafer, said measuring being performed during a post-exposure bake of the wafer,
   the evolving signals corresponding to vector combinations of
   (i) time dependent light diffracted from the pattern appearing in the photoresist; and
   (ii) substantially time invariant light diffracted due to any underlying pattern beneath the photoresist;

(2) combining the measurements for detecting a change in the signal over time thereby obtaining a measure of the strength of the latent image; and (3) comparing said measure of the strength of the latent image to a predetermined value correlated to a desired line dimension in the photoresist pattern to terminate the bake when an end point condition is met.

2. A method according to claim 1, comprising the step of realizing step (1) by providing an optical assembly, the optical assembly comprising:

(1) at least one illumination source; and
   (2) at least one optical collection detector;

the optical assembly having a capability of observing a change in diffraction efficiency of a wafer which diffracts from its surface illumination from a source to a detector.

* * * * *